United States Patent
Lin et al.

(10) Patent No.: US 12,095,472 B2
(45) Date of Patent: Sep. 17, 2024

(54) TRANSCEIVER CIRCUIT AND CONTROL METHOD OF FREQUENCY SYNTHESIZER

(71) Applicant: Realtek Semiconductor Corp., HsinChu (TW)

(72) Inventors: Wei-Cheng Lin, HsinChu (TW); Ching-Her Huang, HsinChu (TW); Yi-Chang Shih, HsinChu (TW); Yu-Jung Li, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 35 days.

(21) Appl. No.: 18/092,940

(22) Filed: Jan. 4, 2023

(65) Prior Publication Data
US 2023/0231564 A1    Jul. 20, 2023

(30) Foreign Application Priority Data

Jan. 17, 2022  (TW) .................................. 111101848

(51) Int. Cl.
| | |
|---|---|
| H03L 7/18 | (2006.01) |
| H03L 7/08 | (2006.01) |
| H03L 7/089 | (2006.01) |
| H03L 7/093 | (2006.01) |
| H04B 1/40 | (2015.01) |

(52) U.S. Cl.
CPC .............. *H03L 7/18* (2013.01); *H03L 7/0802* (2013.01); *H03L 7/0891* (2013.01); *H03L 7/093* (2013.01); *H04B 1/40* (2013.01)

(58) Field of Classification Search
CPC .... H04B 1/18; H04B 1/40; H03L 7/18; H03L 7/0802; H03L 7/0891; H03L 7/093
USPC .............................. 455/208; 331/34, 16, 179
See application file for complete search history.

(56) References Cited

U.S. PATENT DOCUMENTS

| | | | |
|---|---|---|---|
| 8,208,596 B2* | 6/2012 | Chatwin .................. | H04L 7/033 331/34 |
| 2009/0111409 A1* | 4/2009 | Sun ........................... | H03L 1/00 455/208 |
| 2009/0206894 A1* | 8/2009 | Wang ..................... | H03L 7/0898 327/157 |

* cited by examiner

*Primary Examiner* — Arnold M Kinkead
(74) *Attorney, Agent, or Firm* — Winston Hsu

(57) ABSTRACT

The present invention provides a transceiver circuit including a transmitter circuit, a frequency synthesizer and control circuit. The transmitter circuit is configured to generate a transmission signal, wherein the transmission signal is transmitted through an antenna. The frequency synthesizer is configured to generate a clock signal for the transmitter circuit to generate the transmission signal. The control circuit is configured to generate a first control signal to control the frequency synthesizer to determine a loop bandwidth of the frequency synthesizer; wherein when the transceiver circuit operates in a standby mode, the control circuit generates the first control signal to make the frequency synthesizer have a first loop bandwidth; and after a period of time after the transceiver circuit is switched from the standby mode to a transmission mode, the control circuit generates the first control signal to make the frequency synthesizer have a second loop bandwidth.

14 Claims, 4 Drawing Sheets

TRANSCEIVER CIRCUIT AND CONTROL METHOD OF FREQUENCY SYNTHESIZER

BACKGROUND OF THE INVENTION

1. Field of the Invention

The present invention relates to a frequency synthesizer of a transceiver circuit.

2. Description of the Prior Art

The current frequency synthesizer only has a single loop bandwidth, however, in a carrier frequency offset and drift test of a Bluetooth system, if the frequency synthesizer has a wider loop bandwidth, it will have a faster frequency locking speed to obtain a smaller frequency drift, so that the Bluetooth system has good performance in the carrier frequency offset and drift test. However, when the frequency synthesizer is designed with a wide loop bandwidth, noise generated by other areas in the circuit is more likely to enter the frequency synthesizer, resulting in worse error vector magnitude (EVM) of a modulation characteristics test of the Bluetooth system.

SUMMARY OF THE INVENTION

It is therefore an objective of the present invention to provide a frequency synthesizer with an adjustable loop bandwidth, which can set different loop bandwidths during the operation of the Bluetooth system, so that the Bluetooth system has better performance in carrier frequency offset and drift and modulation characteristics, and the frequency synthesizer has a simple structure to avoid increasing design and manufacturing costs, so as to solve the problems described in the prior art.

In one embodiment of the present invention, a transceiver circuit comprising a transmitter circuit, a frequency synthesizer and control circuit is disclosed. The transmitter circuit is configured to generate a transmission signal, wherein the transmission signal is transmitted through an antenna. The frequency synthesizer is configured to generate a clock signal for the transmitter circuit to generate the transmission signal. The control circuit is configured to generate a first control signal to control the frequency synthesizer to determine a loop bandwidth of the frequency synthesizer; wherein when the transceiver circuit operates in a standby mode, the control circuit generates the first control signal to make the frequency synthesizer have a first loop bandwidth; and after a period of time after the transceiver circuit is switched from the standby mode to a transmission mode, the control circuit generates the first control signal to make the frequency synthesizer have a second loop bandwidth.

In one embodiment of the present invention, a control method of a frequency synthesizer of a transceiver circuit comprises the steps of: when the transceiver circuit operates in a standby mode, controlling the frequency synthesizer to have a first loop bandwidth; and after a period of time after the transceiver circuit is switched from the standby mode to a transmission mode, generating the first control signal to make the frequency synthesizer have a second loop bandwidth, wherein the first loop bandwidth is higher than the second loop bandwidth.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
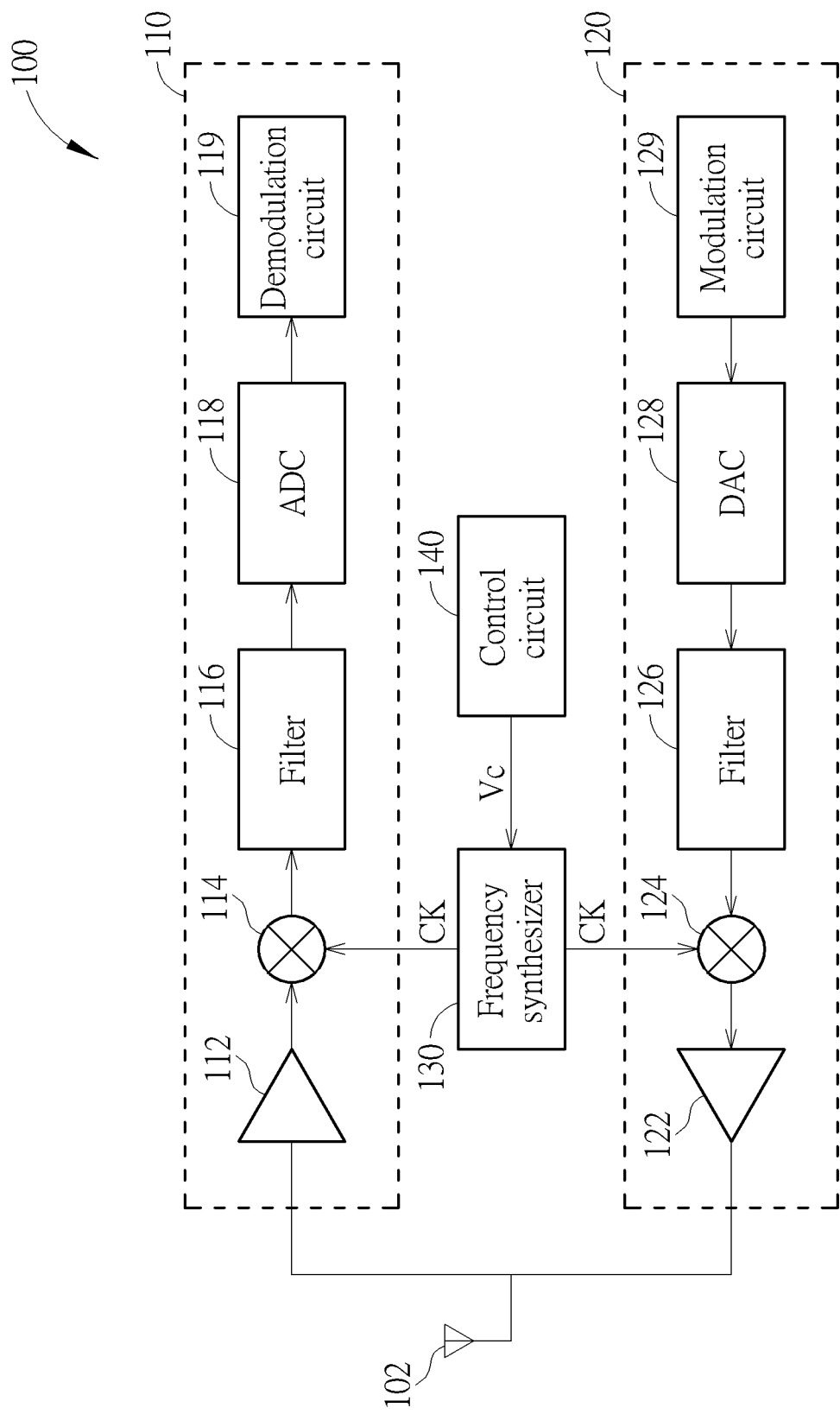
FIG. 1 is a diagram illustrating a Bluetooth transceiver circuit according to one embodiment of the present invention.

FIG. 1 is a diagram of a Bluetooth transceiver circuit 100 according to one embodiment of the present invention. As shown in FIG. 1, the Bluetooth transceiver circuit 100 includes a receiver circuit 110, a transmitter circuit 120, a frequency synthesizer 130 and a control circuit 140, wherein the receiver circuit 110 at least comprises a low-noise amplifier 112, a mixer 114, a filter 116, an analog-to-digital converter (ADC) 118 and a demodulation circuit 119; and the transmitter circuit 120 at least comprises a power amplifier 122, a mixer 124, a filter 126, a digital-to-analog converter (DAC) 128 and a modulation circuit 129. In addition, the Bluetooth transceiver circuit 100 transmits and receives packets through at least one antenna 102.

In the operation of the Bluetooth transceiver circuit 100, the receiver circuit 110 receives a received signal through the antenna 102, and after processing by the low-noise amplifier 112, the mixer 114 uses a clock signal CK generated by the frequency synthesizer 130 to mix the received signal to generate a mixed signal. Then, the mixed signal passes through the filter 116 for low-pass filtering, and then passes through the ADC 118 for analog-to-digital conversion operation, and then is inputted to the demodulation circuit 119 for processing. In addition, regarding the operation of the transmitter circuit 120, the modulation circuit 129 first generates data to be transmitted to the DAC 128 for digital-to-analog conversion operation, and then the filter 126 filters an output signal of the DAC 128 to generate a filtered signal. Then, the mixer 124 uses the clock signal CK generated by the frequency synthesizer 130 to perform a mixing operation on the filtered signal to generate a transmission signal, and the transmission signal is processed by the power amplifier 122 and then transmitted through the antenna 102. It should be noted that since the operations of the receiver circuit 110 and the transmitter circuit 120 are well known to a person skilled in the art, and the focus of the present invention is on the loop bandwidth adjustment of the frequency synthesizer 130, the receiver circuit 110 and the transmitter circuit 120 details are omitted here.

Figure 2:
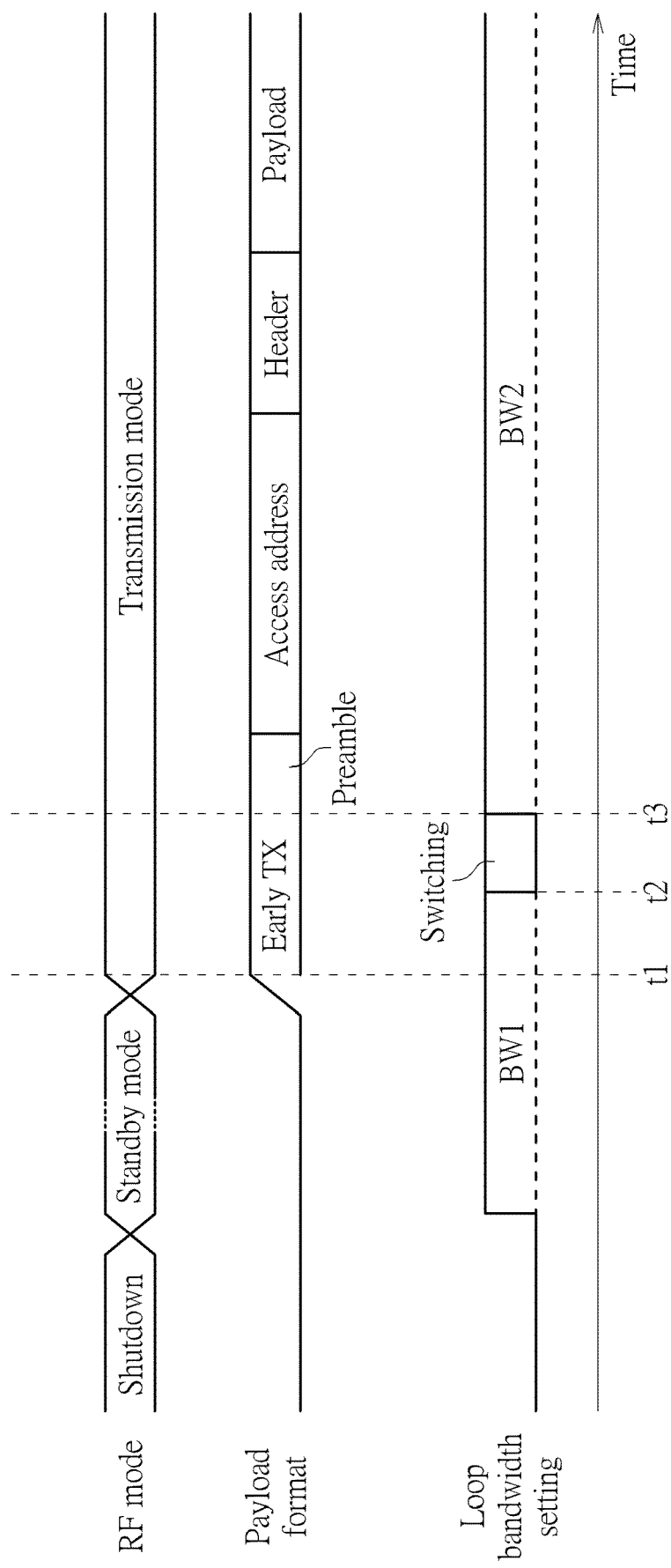
FIG. 2 is a timing diagram of a radio-frequency (RF) mode, a payload format and a loop bandwidth setting of a frequency synthesizer of the Bluetooth transceiver circuit according to one embodiment of the present invention.

FIG. 2 is a timing diagram of a RF mode, a payload format and a loop bandwidth setting of the frequency synthesizer 130 of the Bluetooth transceiver circuit 100 according to one embodiment of the present invention. First, the Bluetooth transceiver circuit 100 is powered on, and the Bluetooth transceiver circuit 100 enters a standby mode from a shutdown mode. In the standby mode, each element in the Bluetooth transceiver circuit 100 starts to receive a supply voltage, and at this time, the control circuit 140 starts to generate a control signal Vc to control the frequency synthesizer 130 to have a first loop bandwidth BW1. In this embodiment, the first loop bandwidth BW1 is a higher loop bandwidth.

At time t1, the Bluetooth transceiver circuit 100 enters a transmission mode, and at the beginning of the transmission mode, the transmitter circuit 120 will transmit a signal other than the Bluetooth specification. The purpose is not only to ensure that the frequency synthesizer 130 can perform frequency-locking normally, but also to provide the receiver with a period of time to adjust frequency and gain, and this period of time can be called an early transmission (Early TX). Specifically, when the Bluetooth transceiver circuit 100 is in the early transmission phase, the power amplifier 122 of the transmitter circuit 120 is enabled and starts to operate, and other control circuits of the Bluetooth transceiver circuit 100 start to perform preceding operations such as transmission power detection, etc., and frequency synthesizer 130 starts to generate the clock signal CK. In this embodiment, since the first loop bandwidth BW1 of the frequency synthesizer 130 is a relatively high loop bandwidth, when the Bluetooth transceiver circuit 100 switches from the standby mode to the transmission mode, the frequency synthesizer 130 can directly use the higher loop bandwidth to generate the clock signal CK, so that the frequency synthesizer 130 can output the clock signal CK with the desired frequency (e.g., 2.4 GHz) in a short time. In this embodiment, in the early transmission phase, the transmitter circuit 120 only generates the transmission signal for detection, but does not transmit any Bluetooth packet.

At time t2, the control circuit 140 generates the control signal Vc to control the frequency synthesizer 130 to have a second loop bandwidth BW2. In this embodiment, the second loop bandwidth BW2 has a lower bandwidth, that is, the second loop bandwidth BW2 is smaller than the first loop bandwidth BW1.

At time t3, the early transmission phase ends, the transmitter circuit 120 starts to transmit Bluetooth packets, wherein the Bluetooth packets may comprise a preamble, an access address, a header and a payload in sequence, and in the Bluetooth specification, the preamble can be 1-2 bytes, the access address can be 4 bytes, the header can be 2 bytes, and the payload can be 0-255 bytes. In the carrier frequency offset and drift test, an average frequency of the preamble is calculated and defined as f0, and frequencies f1, f2, . . . measured according to the specification are compared with f0 to calculate the frequency offset. In this embodiment, since the frequency synthesizer 130 has locked the frequency of the clock signal CK before the transmitter circuit 120 starts to transmit the Bluetooth packets, the Bluetooth transceiver circuit 100 will have a small frequency offset, so it can have better performance in the carrier frequency offset and drift test. In addition, since the frequency synthesizer 130 has been switched to have a lower second loop bandwidth BW2 before the transmitter circuit 120 starts to transmit Bluetooth packets, noise generated by other areas in the Bluetooth transceiver circuit 100 will not enter the frequency synthesizer 130 in large quantities, that is the Bluetooth system has better performance in the modulation characteristics test.

In one embodiment, since the time t1 at which the Bluetooth transceiver circuit 100 enters the transmission mode from the standby mode is known, a time length for the frequency synthesizer 130 to generate the clock signal CK with the desired frequency under the condition of having the first loop bandwidth BW1 can be obtained through simulation, and the time length for the frequency synthesizer 130 to generate the clock signal CK with the desired frequency under the condition of switching to the second loop bandwidth BW2 can also be obtained through simulation, the control circuit 140 can determine an appropriate first loop bandwidth BW1 and an appropriate time t2 to perform loop bandwidth switching. In one embodiment, the control circuit 140 may start to use a timer to count down at the time t1, so as to switch to the second loop bandwidth BW2 at the time t2 when the frequency synthesizer 130 has generated the stable clock signal CK.

Figure 3:
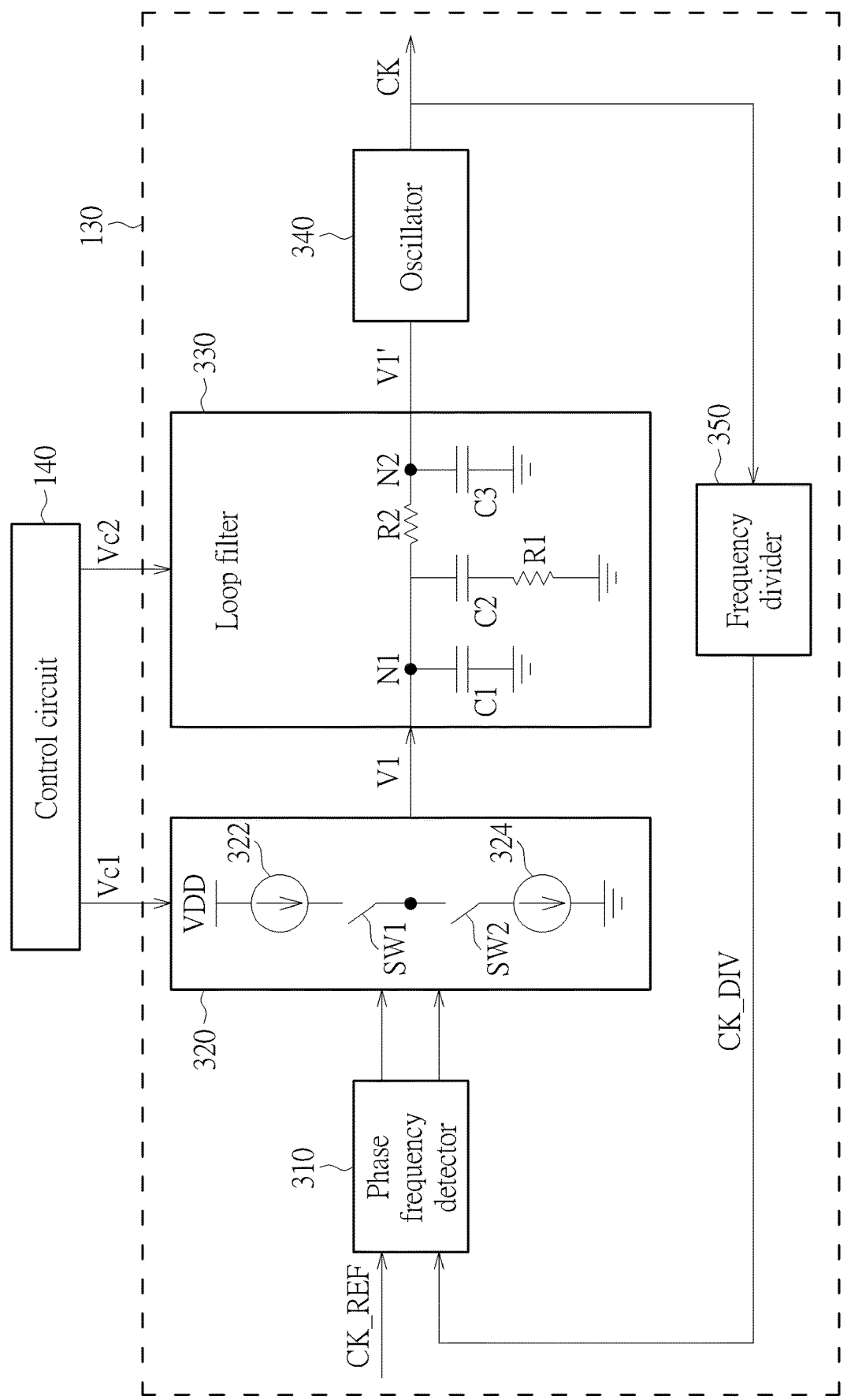
FIG. 3 is a diagram illustrating a frequency synthesizer and a control circuit according to one embodiment of the present invention.

FIG. 3 is a diagram illustrating the frequency synthesizer 130 and the control circuit 140 according to one embodiment of the present invention. As shown in FIG. 3, the frequency synthesizer 130 comprises a phase frequency detector 310, a charge pump 320, a loop filter 330, an oscillator 340 and a frequency divider 350. The charge pump 320 comprises at least two current sources 332, 334 and two switches SW1, SW2, wherein the current source 332 is coupled to a supply voltage VDD, and is used to charge an output terminal N1 of the charge pump 320 through the switch SW1; and the current source 334 is coupled to a ground voltage, and is used to discharge the output terminal N1 of the charge pump 320 through the switch SW2. The loop filter 330 comprises capacitors C1-C3 and resistors R1 and R2, wherein the capacitor C1 is coupled between the terminal N1 and the ground voltage, the capacitor C2 and the resistor R1 connected in series are coupled between the terminal N1 and the ground voltage, the resistor R2 is coupled between the terminal N1 and a terminal N2, and the capacitor C3 is coupled between the terminal N2 and the ground voltage.

In the basic operation of the frequency synthesizer 130, the phase frequency detector 310 receives a reference clock signal CK_REF and a frequency-divided clock signal CK_DIV to generate a detection result, the charge pump 320 enable/disable the switches SW1 and SW2 to generate a control signal V1 according to the detection result, the loop filter 330 performs a low-pass filtering operation on the control signal V1 to generate a filtered control signal V1', the oscillator 340 generates the clock signal CK according to the filtered control signal V1', and the frequency divider 350 performs a frequency division operation on the clock signal CK to generate the frequency-divided clock signal CK_DIV. It should be noted that, since the basic functions of each element of the frequency synthesizer 130 are well known to a person skilled in the art, and the focus of this embodiment is on the setting of the loop bandwidth, the detailed structure/operation of each element are omitted here.

In the embodiment of FIG. 3, the current sources 332 and 334 in the charge pump 320 are variable current sources, and the control circuit 140 can generate a control signal Vc1 to control a current of the current sources 332 and 334 to adjust the loop bandwidth of frequency synthesizer 130. For example, the control circuit 140 can generate the control signal Vc1 to make the current sources 332 and 334 have a higher first current, so that the frequency synthesizer 130 has the higher first loop bandwidth BW1; and the control circuit 140 can generate the control signal Vc1 to make the current sources 332 and 334 have a lower second current, so that the frequency synthesizer 130 has the lower second loop bandwidth BW2. In addition, at least part of the capacitors C1-C3 and the resistors R1, R2 included in the loop filter 330 can be variable capacitors/variable resistors, and the control circuit 140 can generate a control signal Vc2 to control the capacitance/resistance of at least part of C1-C3 and the resistors R1, R2, to adjust the loop bandwidth of the frequency synthesizer 130. For example, the control circuit 140 can generate the control signal Vc2 to adjust the capacitance/resistance of the capacitors/resistors in the loop filter 330 to have a higher cutoff frequency, so that the frequency synthesizer 130 has the higher first loop Bandwidth BW1; and the control circuit 140 can generate the control signal Vc2 to adjust the capacitance/resistance of the capacitors/resistors in the loop filter 330 to have a lower cutoff frequency, so that the frequency synthesizer 130 has the lower first loop Bandwidth BW2.

In the embodiment shown in FIG. 3, the control circuit 140 simultaneously generates the control signal Vc1 and the control signal Vc2 to control the charge pump 320 and the loop filter 330 to obtain the required loop bandwidth, however, the present invention is not limited to this. In other embodiments, the control circuit 140 can only generate the control signal Vc1 to control the charge pump 320 to obtain the desired loop bandwidth, or only generate the control signal Vc2 to control the loop filter 330 to obtain the desired loop bandwidth, without the need for simultaneously control the charge pump 320 and the loop filter 330. These alternative designs shall fall within the scope of the present invention.

It should be noted that the internal circuit structures of the charge pump 320 and the loop filter 330 shown in FIG. 3 are only illustrative, and not a limitation of the present invention. In other embodiments, the charge pump 320 may have a different number of current sources, and the loop filter 330 may have a different resistor/capacitor configuration. As long as the control circuit 140 can achieve the purpose of controlling the loop bandwidth by controlling a current amount of at least one current source in the charge pump 320, and/or controlling capacitance or resistance in the loop filter 320, the charge pump 320 and the loop filter 330 can have any suitable design.

In the embodiments of FIG. 1 to FIG. 3, the frequency synthesizer 130 with adjustable loop bandwidth is applied in the Bluetooth transceiver circuit 100, however, it's not a limitation of the present invention. In other embodiments, the frequency synthesizer 130 with an adjustable loop bandwidth can be applied to transceiver circuits of other specifications.

Figure 4:
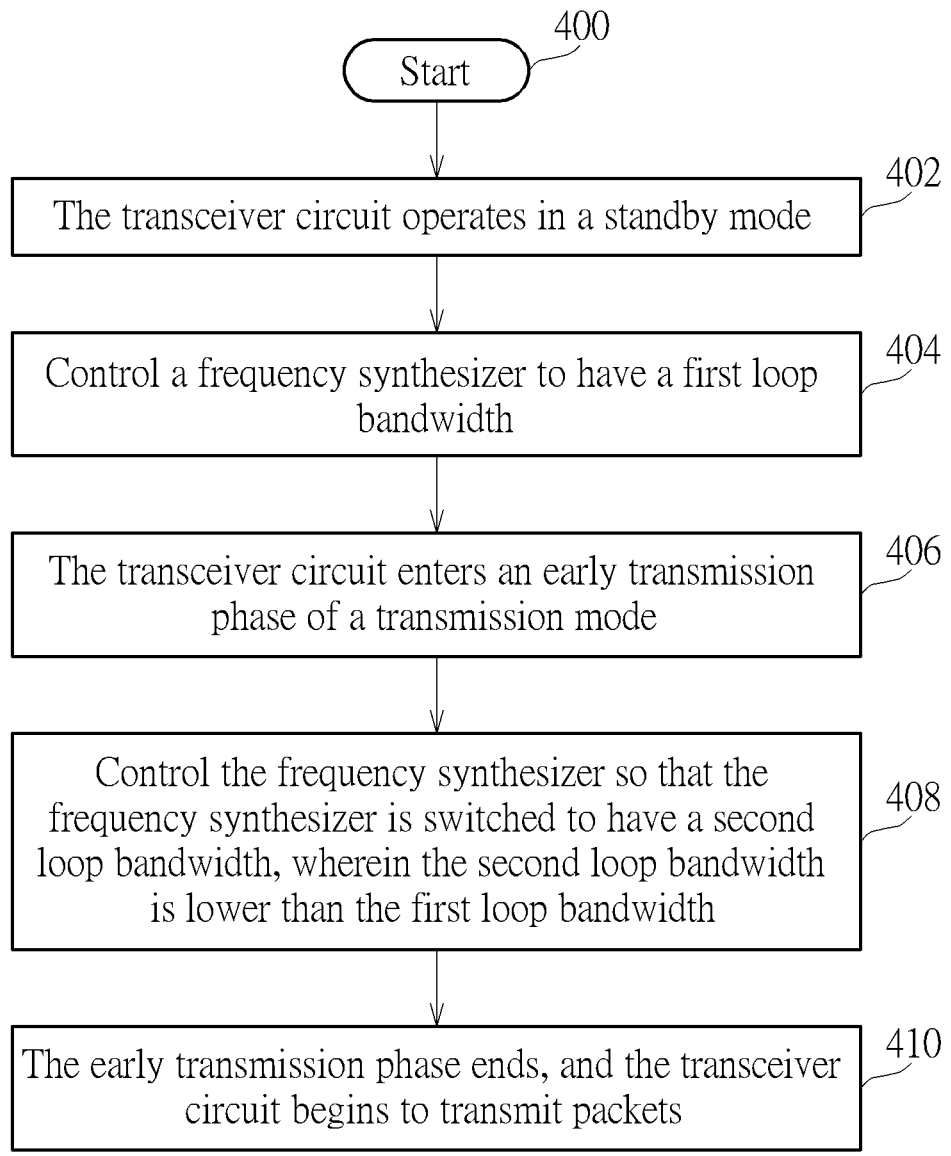
FIG. 4 is a flowchart of a control method of the frequency synthesizer of the transceiver circuit according to one embodiment of the present invention.

FIG. 4 is a flowchart of a control method of the frequency synthesizer of the transceiver circuit according to one embodiment of the present invention. Referring to the above embodiments, the flow is described as follows.

Step 400: the flow starts, and the transceiver is powered on.

Step 402: the transceiver circuit operates in a standby mode.

Step 404: control a frequency synthesizer to have a first loop bandwidth.

Step 406: the transceiver circuit enters an early transmission phase of a transmission mode.

Step 408: control the frequency synthesizer so that the frequency synthesizer is switched to have a second loop bandwidth, wherein the second loop bandwidth is lower than the first loop bandwidth.

Step 410: the early transmission phase ends, and the transceiver circuit begins to transmit packets.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transceiver circuit, comprising:
   a transmitter circuit, configured to generate a transmission signal, wherein the transmission signal is transmitted through an antenna;
   a frequency synthesizer, configured to generate a clock signal for the transmitter circuit to generate the transmission signal;
   a control circuit, configured to generate a first control signal to control the frequency synthesizer to determine a loop bandwidth of the frequency synthesizer; wherein when the transceiver circuit operates in a standby mode, the control circuit generates the first control signal to make the frequency synthesizer have a first loop bandwidth; and after a period of time after the transceiver circuit is switched from the standby mode to a transmission mode, the control circuit generates the first control signal to make the frequency synthesizer have a second loop bandwidth;
   wherein after the period of time after the transceiver circuit is switched from the standby mode to the transmission mode, and the transceiver circuit operates in an early transmission phase of the transmission mode, the control circuit generates the first control signal to make the frequency synthesizer have the second loop bandwidth.

2. The transceiver circuit of claim 1, wherein the first loop bandwidth is higher than the second loop bandwidth.

3. The transceiver circuit of claim 1, wherein after the transceiver circuit finishes the early transmission phase and the frequency synthesizer already has the second loop bandwidth, the transmitter circuit starts to generate a packet as the transmission signal.

4. The transceiver circuit of claim 1, wherein the frequency synthesizer comprises:
   a phase frequency detector, configured to receive a reference clock signal and a frequency-divided clock signal to generate a detection result;
   a charge pump, coupled to the phase frequency detector, configured to generate a control signal according to the detection result;
   a loop filter, coupled to the charge pump, configured to filter the control signal to generate a filtered control signal;
   an oscillator, coupled to the loop filter, configured to generate the clock signal according to the filtered control signal; and
   a frequency divider, coupled to the oscillator and the phase frequency detector, configured to perform a frequency division operation on the clock signal to generate the frequency-divided clock signal;
   wherein the control circuit generates the first control signal to control current amount of at least one current source of the charge pump, to determine the loop bandwidth of the frequency synthesizer.

5. The transceiver circuit of claim 4, wherein when the transceiver circuit operates in the standby mode, the control circuit generates the first control signal to make the at least one current source have first current amount, so that the frequency synthesizer have the first loop bandwidth; and the period of time after the transceiver circuit is switched from the standby mode to the transmission mode, the control circuit generates the first control signal to make the at least one current source have second current amount, so that the frequency synthesizer have the second loop bandwidth, wherein the first current amount is greater than the second current amount.

6. The transceiver circuit of claim 4, wherein the control circuit further generates a second control signal to control resistance or capacitance of component(s) within the loop filter, to determine the loop bandwidth of the frequency synthesizer.

7. The transceiver circuit of claim 1, wherein the frequency synthesizer comprises:
a phase frequency detector, configured to receive a reference clock signal and a frequency-divided clock signal to generate a detection result;
a charge pump, coupled to the phase frequency detector, configured to generate a control signal according to the detection result;
a loop filter, coupled to the charge pump, configured to filter the control signal to generate a filtered control signal;
an oscillator, coupled to the loop filter, configured to generate the clock signal according to the filtered control signal; and
a frequency divider, coupled to the oscillator and the phase frequency detector, configured to perform a frequency division operation on the clock signal to generate the frequency-divided clock signal;
wherein the control circuit generates the first control signal to control resistance or capacitance of component(s) within the loop filter, to determine the loop bandwidth of the frequency synthesizer.

8. The transceiver circuit of claim 1, wherein the transceiver circuit is a Bluetooth transceiver circuit.

9. A control method of a frequency synthesizer of a transceiver circuit, comprising:
when the transceiver circuit operates in a standby mode, controlling the frequency synthesizer to have a first loop bandwidth; and
after a period of time after the transceiver circuit is switched from the standby mode to a transmission mode, generating the first control signal to make the frequency synthesizer have a second loop bandwidth, wherein the first loop bandwidth is higher than the second loop bandwidth;
wherein the step of generating the first control signal to make the frequency synthesizer have the second loop bandwidth comprises:
after the period of time after the transceiver circuit is switched from the standby mode to a transmission mode, and the transceiver circuit operates in an early transmission phase of the transmission mode, generating the first control signal to make the frequency synthesizer have the second loop bandwidth.

10. The control method of claim 9, further comprising:
after the transceiver circuit finishes the early transmission phase and the frequency synthesizer already has the second loop bandwidth, the transceiver circuit starts to generate a packet, wherein the packet is transmitted through an antenna.

11. The control method of claim 9, wherein the frequency synthesizer comprises:
a phase frequency detector, configured to receive a reference clock signal and a frequency-divided clock signal to generate a detection result;
a charge pump, coupled to the phase frequency detector, configured to generate a control signal according to the detection result;
a loop filter, coupled to the charge pump, configured to filter the control signal to generate a filtered control signal;
an oscillator, coupled to the loop filter, configured to generate the clock signal according to the filtered control signal; and
a frequency divider, coupled to the oscillator and the phase frequency detector, configured to perform a frequency division operation on the clock signal to generate the frequency-divided clock signal; and
the control method further comprises:
generating the first control signal to control current amount of at least one current source of the charge pump, to determine the loop bandwidth of the frequency synthesizer.

12. The control method of claim 11, further comprising:
generating a second control signal to control resistance or capacitance of component(s) within the loop filter, to determine the loop bandwidth of the frequency synthesizer.

13. The control method of claim 9, wherein the frequency synthesizer comprises:
a phase frequency detector, configured to receive a reference clock signal and a frequency-divided clock signal to generate a detection result;
a charge pump, coupled to the phase frequency detector, configured to generate a control signal according to the detection result;
a loop filter, coupled to the charge pump, configured to filter the control signal to generate a filtered control signal;
an oscillator, coupled to the loop filter, configured to generate the clock signal according to the filtered control signal; and
a frequency divider, coupled to the oscillator and the phase frequency detector, configured to perform a frequency division operation on the clock signal to generate the frequency-divided clock signal; and
the control method further comprises:
generating the first control signal to control resistance or capacitance of component(s) within the loop filter, to determine the loop bandwidth of the frequency synthesizer.

14. The control method of claim 9, wherein the transceiver circuit is a Bluetooth transceiver circuit.

* * * * *